United States Patent
Jung

(10) Patent No.: US 9,799,717 B2
(45) Date of Patent: Oct. 24, 2017

(54) ORGANIC LIGHT EMITTING DIODE DISPLAY

(71) Applicant: LG DISPLAY CO., LTD., Seoul (KR)

(72) Inventor: Sanghoon Jung, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/251,727

(22) Filed: Aug. 30, 2016

(65) Prior Publication Data

US 2017/0062542 A1 Mar. 2, 2017

(30) Foreign Application Priority Data

Aug. 31, 2015 (KR) .................. 10-2015-0123247

(51) Int. Cl.
*H01L 27/32* (2006.01)
*H01L 51/52* (2006.01)

(52) U.S. Cl.
CPC ...... *H01L 27/3272* (2013.01); *H01L 51/5203* (2013.01)

(58) Field of Classification Search
CPC .................. H01L 27/3272; H01L 51/5203
See application file for complete search history.

(56) References Cited

U.S. PATENT DOCUMENTS

| 2007/0159565 A1* | 7/2007 | Segawa | G02F 1/136209 349/38 |
| 2007/0296333 A1* | 12/2007 | Kim | H01L 27/3272 313/506 |
| 2015/0187959 A1* | 7/2015 | Yoon | H01L 27/1225 257/43 |
| 2015/0379923 A1* | 12/2015 | Lee | G09G 3/3233 345/206 |
| 2016/0005803 A1* | 1/2016 | Ryu | H01L 27/3248 257/40 |
| 2016/0093647 A1* | 3/2016 | Kim | G02F 1/136227 349/46 |
| 2017/0162822 A1* | 6/2017 | Park | H01L 51/5237 |

* cited by examiner

*Primary Examiner* — Allan R Wilson
(74) *Attorney, Agent, or Firm* — Dentons US LLP

(57) ABSTRACT

An organic light emitting diode display is disclosed that includes a shield layer on a substrate; a semiconductor layer on the shield layer; a gate insulating layer on the semiconductor layer; a first gate electrode on the gate insulating layer; a first interlayer dielectric layer on the first gate electrode; a second gate electrode and a connection electrode on the first interlayer dielectric layer, the connection electrode electrically connected to the shield layer and passing through the semiconductor layer; a second interlayer dielectric layer on the second gate electrode and the connection electrode; a source electrode and a drain electrode on the second interlayer dielectric layer, the drain electrode electrically connected to the semiconductor layer and the source electrode electrically connected to the connection electrode; an insulating layer on the drain electrode and the source electrode; and a first electrode on the insulating layer and electrically connected to the source electrode.

12 Claims, 17 Drawing Sheets

ORGANIC LIGHT EMITTING DIODE DISPLAY

This application claims the priority benefit of Korean Patent Application No. 10-2015-0123247 filed on Aug. 31, 2015, which is incorporated herein by reference for all purposes as if fully set forth herein.

BACKGROUND

Field of the Invention

The present disclosure relates to an organic light emitting diode (OLED) display and a method of manufacturing the same, and more particularly, to a high-resolution OLED display.

Discussion of the Related Art

Various flat panel displays (FPDs) have been recently developed, replacing cathode ray tubes (CRTs) that are heavy and large in size. Examples of flat panel displays include a liquid crystal display (LCD), a field emission display (FED), a plasma display panel (PDP) and an organic light emitting diode (OLED) display.

An OLED display is a self-emission display device configured to emit light by exciting an organic compound. The OLED display typically does not require a backlight unit, which is used in an LCD device, and thus, can be implemented with thin profile and lightweight by a simplified manufacturing process. The OLED display can be also manufactured at a low temperature and has many advantages such as fast response time of 1 ms or less, low power consumption, wide viewing angle and high contrast.

The OLED display typically includes a light emitting layer of an organic material between a first electrode serving as an anode and a second electrode serving as a cathode. The OLED display forms hole-electron pairs, excitons, by combining the holes received from the first electrode and the electrons received from the second electrode inside the light emitting layer and emits light according to an energy generated when the excitons return to a ground or lower energy level.

As the display technology is advancing, user demands continue to increase. In particular, the pixel size may need to be gradually decreased so as to meet the demand for a high-resolution display device. However, because the OLED display according to the related art has many contact holes in its pixel structure, it may be difficult to decrease the pixel size and increase the resolution of the OLED display.

SUMMARY

Accordingly, embodiments relate to an organic light emitting diode display comprising a shield layer on a substrate; a semiconductor layer on the shield layer; a gate insulating layer on the semiconductor layer; a first gate electrode on the gate insulating layer; a first interlayer dielectric layer on the first gate electrode; a second gate electrode and a connection electrode on the first interlayer dielectric layer, the connection electrode electrically connected to the shield layer and passing through the semiconductor layer; a second interlayer dielectric layer on the second gate electrode and the connection electrode; a source electrode and a drain electrode on the second interlayer dielectric layer, the drain electrode electrically connected to the semiconductor layer and the source electrode electrically connected to the connection electrode; an insulating layer on the drain electrode and the source electrode; and a first electrode on the insulating layer and electrically connected to the source electrode.

The connection electrode is connected to the shield layer through a first contact hole passing through the first interlayer dielectric layer, the gate insulating layer, the semiconductor layer, and the buffer layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

A display device according to an embodiment of the invention is a plastic display device, in which a display element is formed on a flexible plastic substrate. Examples of the plastic display device include an organic light emitting diode (OLED) display, a liquid crystal display (LCD), and an electrophoresis display. Embodiments of the present invention are described using a plastic OLED display by way of example, but the present invention is not limited thereto.

An OLED display includes a light emitting layer of an organic material between a first electrode serving as an anode and a second electrode serving as a cathode. The OLED display is a self-emission display device configured to form hole-electron pairs, excitons, by combining the holes received from the first electrode and the electrons received from the second electrode inside the light emitting layer and emit light according to an energy generated when the excitons return to a ground or lower energy level. The OLED display according to an embodiment of the invention may use a glass substrate as well as a plastic substrate.

Hereinafter, embodiments of the present invention will be described with reference to FIGS. 1 to 11.

Figure 1:
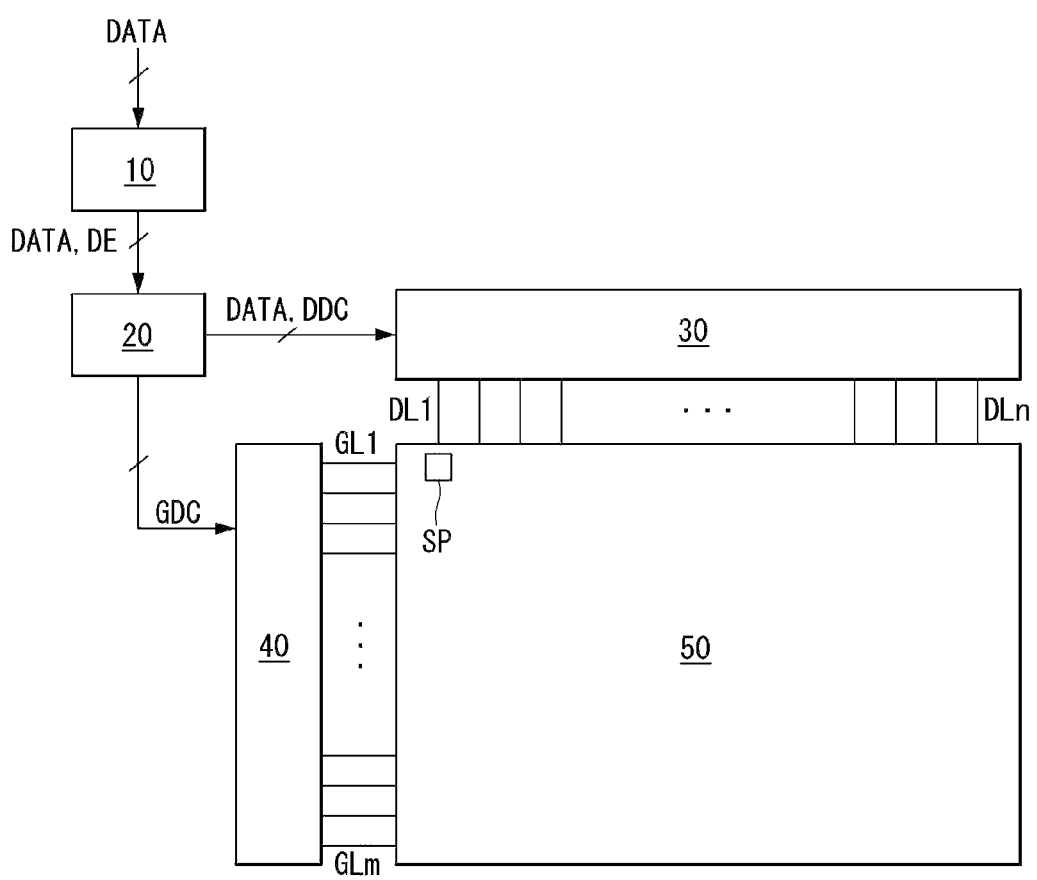
FIG. 1 is a schematic block diagram of an organic light emitting diode (OLED) display.
Figure 2:
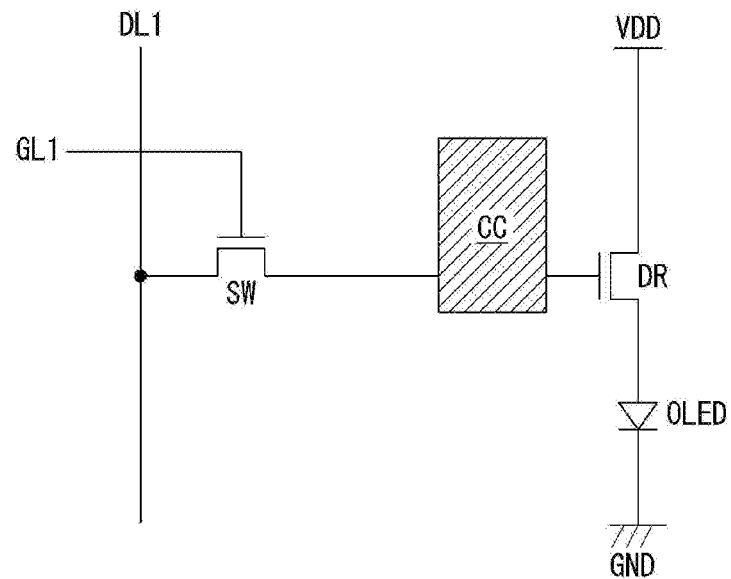
FIG. 2 illustrates a first example of a circuit configuration of a subpixel.
Figure 3:
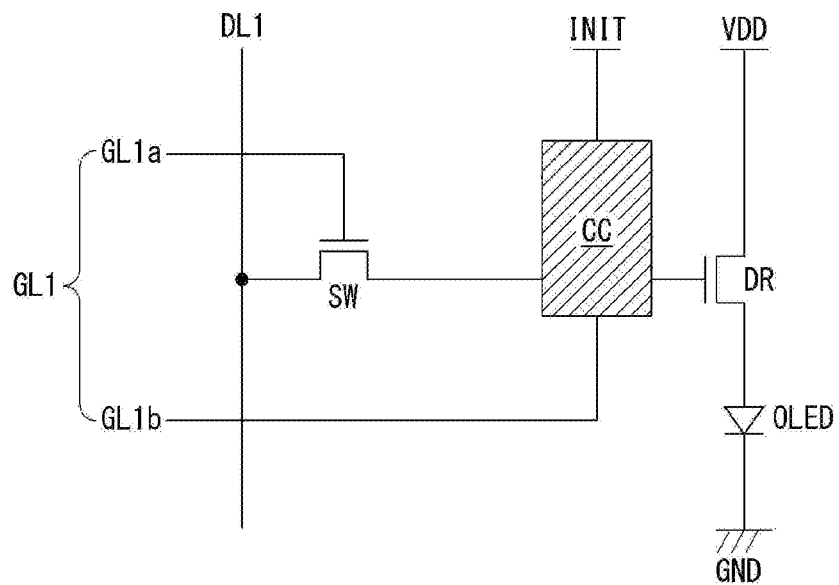
FIG. 3 illustrates a second example of a circuit configuration of a subpixel.

FIG. 1 is a schematic block diagram of an organic light emitting diode (OLED) display. FIG. 2 illustrates a first example of a circuit configuration of a subpixel. FIG. 3 illustrates a second example of a circuit configuration of a subpixel.

Referring to FIG. 1, an OLED display according to an embodiment of the invention includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity and ease of reading, these signals are not shown. The image processing unit 10 is formed on a system circuit board in an integrated circuit (IC) form.

The timing controller 20 receives the data signal DATA and driving signals including the data enable signal DE or the vertical sync signal, the horizontal sync signal, the clock signal, etc. from the image processing unit 10. The timing controller 20 outputs a gate timing control signal GDC for controlling operation timing of the gate driver 40 and a data timing control signal DDC for controlling operation timing of the data driver 30 based on the driving signals. The timing controller 20 is formed on a control circuit board in an IC form.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is formed on a data circuit substrate in an IC form.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board in an IC form or is formed on the display panel 50 in a gate-in panel (GIP) manner The display panel 50 displays an image in response to the data signal DATA and the gate signal respectively received from the data driver 30 and the gate driver 40. The display panel 50 includes subpixels SP for displaying an image Referring to FIG. 2, each subpixel includes a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor as a data voltage in response to a gate signal supplied through a first gate line GL1. The driving transistor DR enables a driving current to flow between a high potential power line VDD and a low potential power line GND based on the data voltage stored in the capacitor. The compensation circuit CC is a circuit for compensating for a threshold voltage of the driving transistor DR. A capacitor connected to the switching transistor SW or the driving transistor DR may be mounted inside the compensation circuit CC.

The compensation circuit CC includes one or more thin film transistors (TFTs) and a capacitor. Configuration of the compensation circuit CC may be variously changed depending on a compensation method. A detailed description thereof may be briefly made or may be entirely omitted.

As shown in FIG. 3, the subpixel including the compensation circuit CC may further include a signal line and a power line for driving a compensation TFT and supplying a predetermined signal or electric power. The added signal line may be defined as a 1-2 gate line GL1b for driving the compensation TFT included in the subpixel. In FIG. 3, "GL1a" is a 1-1 gate line for driving the switching transistor SW. The added power line may be defined as an initialization power line INIT for initializing a predetermined node of the subpixel at a predetermined voltage. However, this is merely an example, and the embodiment of the invention is not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Hereinafter, various subpixel structures, in which the above-described driving transistor DR and the above-described organic light emitting diode are connected, will be described.

First Embodiment

Figure 4:
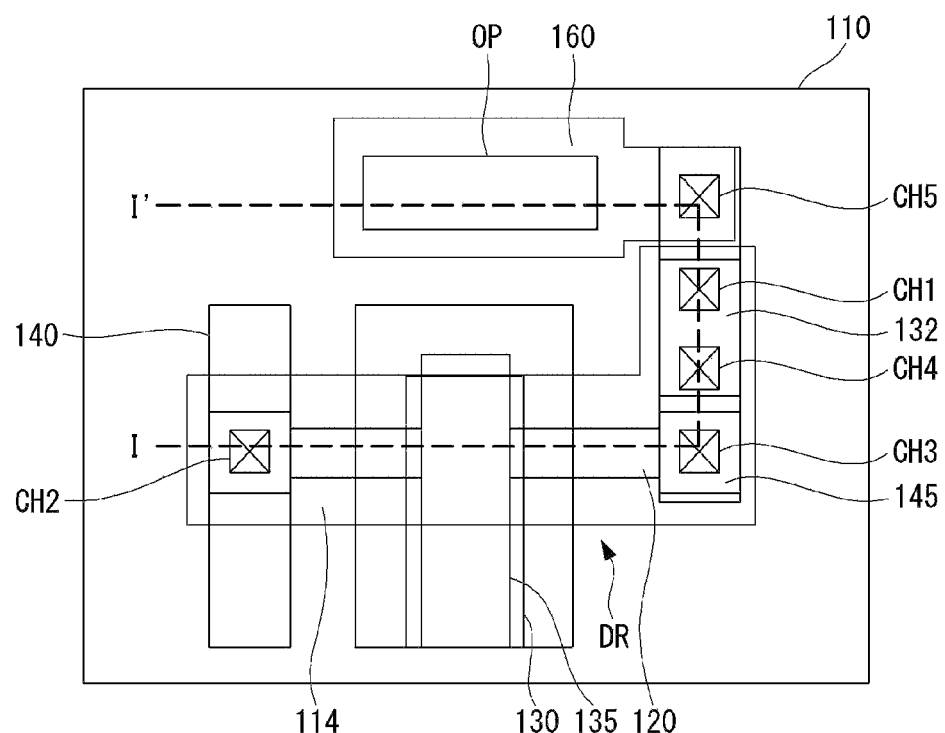
FIG. 4 is a plan view illustrating a part of an OLED display according to a first embodiment of the invention.
Figure 5:
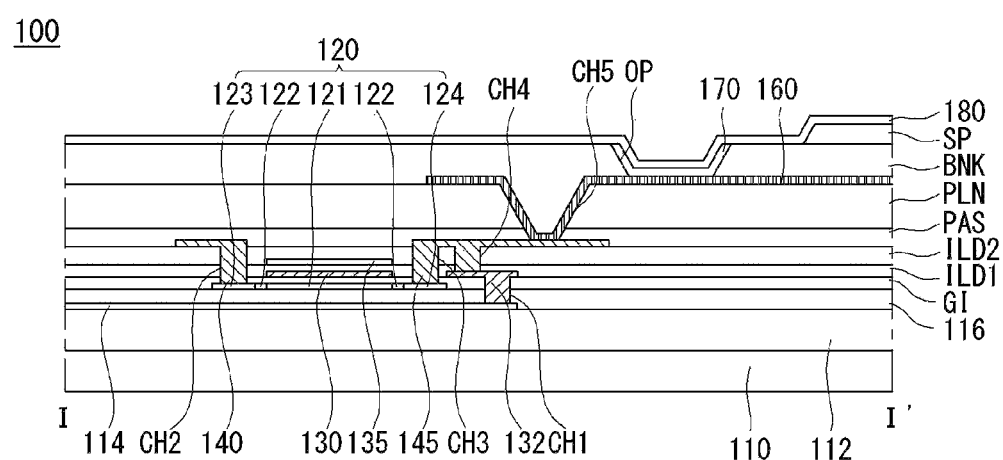
FIG. 5 is a cross-sectional view taken along line I-I' of FIG. 4.

FIG. 4 is a plan view illustrating a part of an OLED display according to a first embodiment of the invention. FIG. 5 is a cross-sectional view taken along line I-I' of FIG. 4.

Referring to FIG. 4, a driving transistor DR and a first electrode 160 are connected to each other on a substrate 110. The driving transistor DR includes a semiconductor layer 120 on a shield layer 114, a first gate electrode 130 corresponding to the semiconductor layer 120, a second gate electrode 135 separated from the first gate electrode 130 at a location corresponding to the first gate electrode 130, and a drain electrode 140 and a source electrode 145 respectively connected to both sides of the semiconductor layer 120.

The drain electrode 140 of the driving transistor DR is connected to the semiconductor layer 120 through a second contact hole CH2, and the source electrode 145 of the driving transistor DR is connected to the semiconductor layer 120 through a third contact hole CH3. Further, the source electrode 145 is connected to a connection electrode 132 through a fourth contact hole CH4, and the connection electrode 132 is connected to the shield layer 114 through a first contact hole CH1. Hence, the source electrode 145 is electrically connected to the shield layer 114. The source electrode 145 of the driving transistor DR is connected to the first electrode 160 through a fifth contact hole CH5. The first electrode 160 is exposed by an opening OP of a bank layer (not shown).

More specifically, referring to FIG. 5, in the OLED display 100 according to the first embodiment of the invention, a first buffer layer 112 is positioned on the substrate 110. The first buffer layer 112 serves to protect a thin film transistor (TFT) formed in a subsequent process from impurities, for example, alkali ions discharged from the substrate 110. The shield layer 114 is positioned on the first buffer layer 112. The shield layer 114 serves to reduce or prevent reduction in a panel driving current which may be generated by using a substrate formed of polyimide. A second buffer layer 116 is positioned on the shield layer 114. The second buffer layer 116 serves to protect a TFT formed in a subsequent process from impurities, for example, alkali ions discharged from the shield layer 114.

The semiconductor layer 120 is positioned on the second buffer layer 116. The semiconductor layer 120 may be formed of a silicon semiconductor or an oxide semiconductor. The silicon semiconductor may include amorphous silicon or crystallized polycrystalline silicon. The polycrystalline silicon has a high mobility (for example, 100 $cm^2/Vs$ or more), low energy power consumption, and excellent reliability, and thus may be applied to a gate driver and/or a multiplexer (MUX) for use in a driving element or applied to a driving TFT of each pixel of the OLED display 100. Because the oxide semiconductor has a low off-current, the oxide semiconductor is suitable for a switching TFT which has a short on-time and a long off-time. Further, because the oxide semiconductor increases a voltage hold time of the pixel due to the low off-current, the oxide semiconductor is suitable for a display device with a slow driving and/or low power consumption. The semiconductor layer 120 includes a drain region 123 and a source region 124 each including p-type or n-type impurities and a channel 121 between the drain region 123 and the source region 124. The semiconductor layer 120 further includes a lightly doped region 122 between the drain region 123 and the source region 124 adjacent to the channel 121.

A gate insulating layer GI is positioned on the semiconductor layer 120. The first gate electrode 130 is positioned on the gate insulating layer GI in a predetermined portion of the semiconductor layer 120, namely, at a location corresponding to the channel 121 when impurities are injected. The first gate electrode 130 serves as a gate electrode of the driving transistor DR. The connection electrode 132 is positioned on one side of the first gate electrode 130. The connection electrode 132 is connected to the shield layer 114 through the first contact hole CH1 passing through the gate insulating layer GI and the second buffer layer 116. The connection electrode 132 is positioned on the same layer as the first gate electrode 130.

A first interlayer dielectric layer ILD1 is positioned on the first gate electrode 130 to insulate the first gate electrode 130. The second gate electrode 135 is positioned on the first interlayer dielectric layer ILD1. The second gate electrode 135 is a capacitor electrode forming a capacitor together with the first gate electrode 130 and does not operate as a gate electrode of the driving transistor DR. A second interlayer dielectric layer ILD2 is positioned on the second gate electrode 135 to insulate the second gate electrode 135. The second and third contact holes CH2 and CH3 are positioned in a portion of each of the second interlayer dielectric layer ILD2, the first interlayer dielectric layer ILD1, and the gate insulating layer GI to expose a portion of the semiconductor layer 120. More specifically, the second contact hole CH2 exposes the drain region 123 of the semiconductor layer 120, and the third contact hole CH3 exposes the source region 124 of the semiconductor layer 120. The fourth contact hole CH4 is positioned in a portion of each of the second interlayer dielectric layer ILD2 and the first interlayer dielectric layer ILD1 to expose the connection electrode 132.

The drain electrode 140 and the source electrode 145 are positioned on the second interlayer dielectric layer ILD2. The drain electrode 140 is connected to the semiconductor layer 120 through the second contact hole CH2 exposing the drain region 123 of the semiconductor layer 120. The source electrode 145 is connected to the semiconductor layer 120 through the third contact hole CH3 exposing the source region 124 of the semiconductor layer 120. Further, the source electrode 145 is connected to the connection electrode 132 through the fourth contact hole CH4, which is formed by penetrating the second interlayer dielectric layer ILD2 and the first interlayer dielectric layer ILD1 and exposes the connection electrode 132. Thus, the driving transistor DR including the semiconductor layer 120, the first gate electrode 130, the drain electrode 140, and the source electrode 145 is formed.

A passivation layer PAS is positioned on the substrate 110 including the driving transistor DR. A planarization layer PLN is positioned on the passivation layer PAS to planarize the parts underlying the planarization layer PLN. The fifth contact hole CH5 is positioned in a portion of each of the passivation layer PAS and the planarization layer PLN to expose the source electrode 145. The first electrode 160 is positioned on the planarization layer PLN. The first electrode 160 serves as a pixel electrode and is connected to the source electrode 145 of the driving transistor DR through the fifth contact hole CH5. A bank layer BNK is positioned on the substrate 110 including the first electrode 160 to define the pixel. The bank layer BNK includes the opening OP exposing the first electrode 160. A light emitting layer 170 contacting the first electrode 160 is positioned in the opening OP of the bank layer BNK, and a second electrode 180 is positioned on the light emitting layer 170.

The OLED display 100 according to the first embodiment of the invention includes the first contact hole CH1 and the fourth contact hole CH4 so as to connect the shield layer 114 to the source electrode 145 of the driving transistor DR.

A method for manufacturing the OLED display according to the first embodiment of the invention will now be described. FIGS. 6A to 6L are cross-sectional views sequentially illustrating a method for manufacturing the OLED display according to the first embodiment of the invention.

Figure 6A:
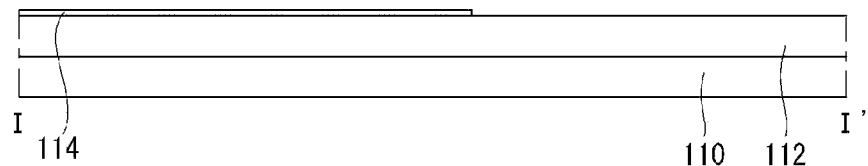
FIGS. 6A to 6L are cross-sectional views sequentially illustrating each of stages in a method for manufacturing an OLED display according to a first embodiment of the invention.

Referring to FIG. 6A, a substrate 110 is prepared. The substrate 110 is made of glass, plastic, or metal, etc. In the embodiment of the invention, the substrate 110 may be made of plastic, and more particularly, may be a polyimide substrate. Thus, the substrate 110 according to the embodiment of the invention may be flexible.

A first buffer layer 112 is formed on the substrate 110. The first buffer layer 112 may be formed as a silicon oxide (SiOx) layer, a silicon nitride (SiNx) layer, or a multilayer thereof. The first buffer layer 112 may be formed using a chemical vapor deposition (CVD) method, a plasma enhanced chemical vapor deposition (PECVD) method, and the like. Subsequently, an opaque material is stacked on the first buffer layer 112 and is patterned using a first mask to form a shield layer 114. The shield layer 114 may be formed of a conductive material, a semiconductor such as silicon, a metal, and the like.

Figure 6B:

Next, referring to FIG. 6B, a second buffer layer 116 is formed on the substrate 110, on which the shield layer 114 is formed. The second buffer layer 116 may be formed as a silicon oxide (SiOx) layer, a silicon nitride (SiNx) layer, or a multilayer thereof through the CVD method, the PECVD method, and the like. Subsequently, a silicon semiconductor or an oxide semiconductor is stacked on the second buffer layer 116 and is patterned using a second mask to form a semiconductor layer 120.

Figure 6C:
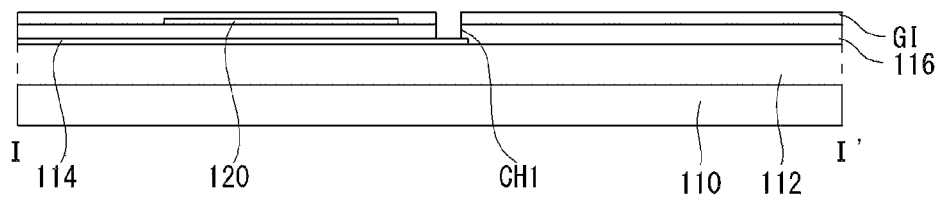

Next, referring to FIG. 6C, a gate insulating layer GI is formed on the substrate 110 including the semiconductor layer 120. The gate insulating layer GI may be formed as a silicon oxide (SiOx) layer, a silicon nitride (SiNx) layer, or a multilayer thereof through the CVD method, the PECVD method, and the like. Subsequently, the second buffer layer 116 and the gate insulating layer GI are etched using a third mask to form a first contact hole CH1 exposing the shield layer 114.

Figure 6D:
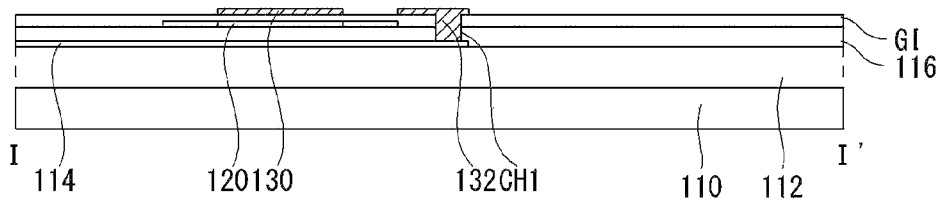

Next, referring to FIG. 6D, a metal material is stacked on the substrate 110, in which the first contact hole CH1 is formed, and is patterned using a fourth mask to form a first gate electrode 130 and a connection electrode 132. The first gate electrode 130 and the connection electrode 132 are formed of one selected from the group including molybdenum (Mo), aluminum (Al), chrome (Cr), gold (Au), titanium (Ti), nickel (Ni), neodymium (Nd), and copper (Cu), or a combination thereof. Further, each of the first gate electrode 130 and the connection electrode 132 may be a multilayer formed of one selected from the group including molybdenum (Mo), aluminum (Al), chrome (Cr), gold (Au), titanium (Ti), nickel (Ni), neodymium (Nd), and copper (Cu), or a combination thereof. For example, each of the first gate electrode 130 and the connection electrode 132 may be formed as a double-layer of Mo/Al—Nd or Mo/Al. The connection electrode 132 is connected to the shield layer 114 through the first contact hole CH1.

Subsequently, n-type impurities are lightly doped on a front surface of the substrate 110 to dope the semiconductor layer 120. In this instance, a remaining portion of the semiconductor layer 120 except the semiconductor layer 120 underlying the first gate electrode 130 is doped using the first gate electrode 130 on the semiconductor layer 120 as a mask.

Figure 6E:
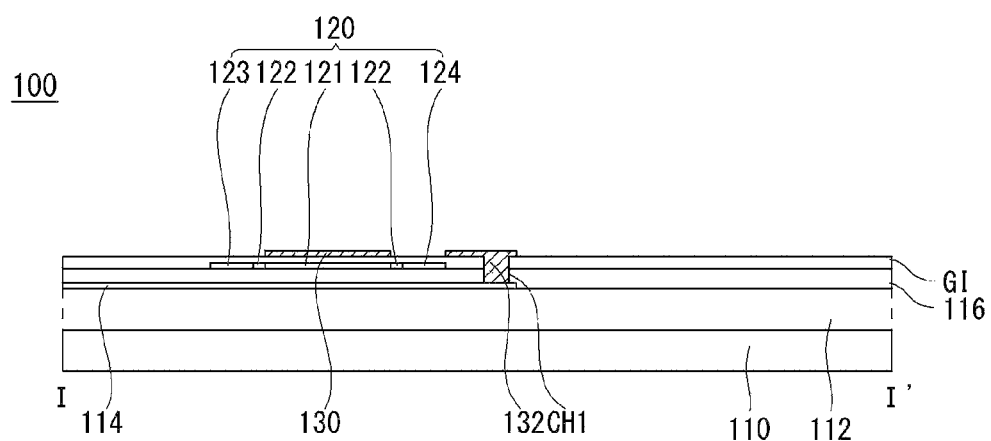

Next, referring to FIG. 6E, n-type impurities are heavily doped on the front surface of the substrate 110 to dope the semiconductor layer 120. In this instance, a channel 121, a lightly doped region 122, a drain region 123, and a source region 124 are formed at the semiconductor layer 120 by masking and doping a predetermined region of the semiconductor layer 120 using a fifth mask.

Figure 6F:
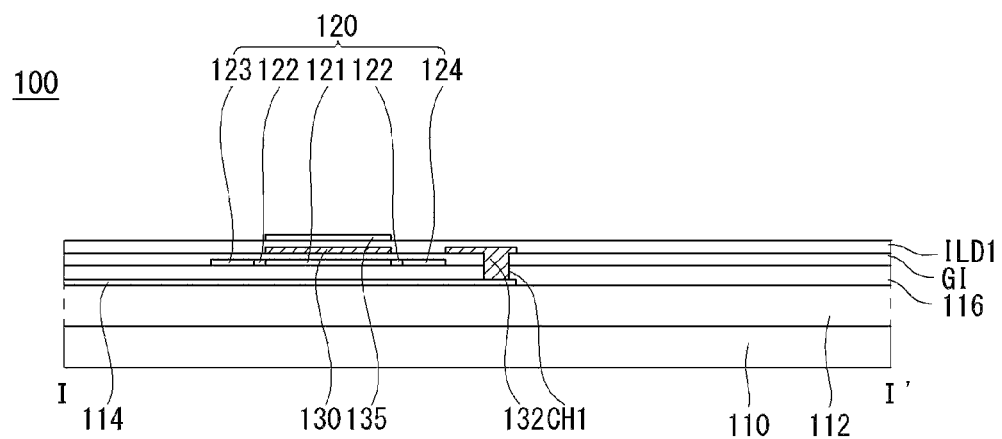

Next, referring to FIG. 6F, a first interlayer dielectric layer ILD1 is formed on the substrate 110, on which the first gate electrode 130 and the connection electrode 132 are formed. The first interlayer dielectric layer ILD1 may be formed as a silicon oxide (SiOx) layer, a silicon nitride (SiNx) layer, or a multilayer thereof through the CVD method, the PECVD method, and the like. Subsequently, a metal material is stacked on the substrate 110 and patterned using a sixth mask to form a second gate electrode 135. The second gate electrode 135 is formed to overlap the first gate electrode 130 and may form a capacitance together with the first gate electrode 130.

Figure 6G:
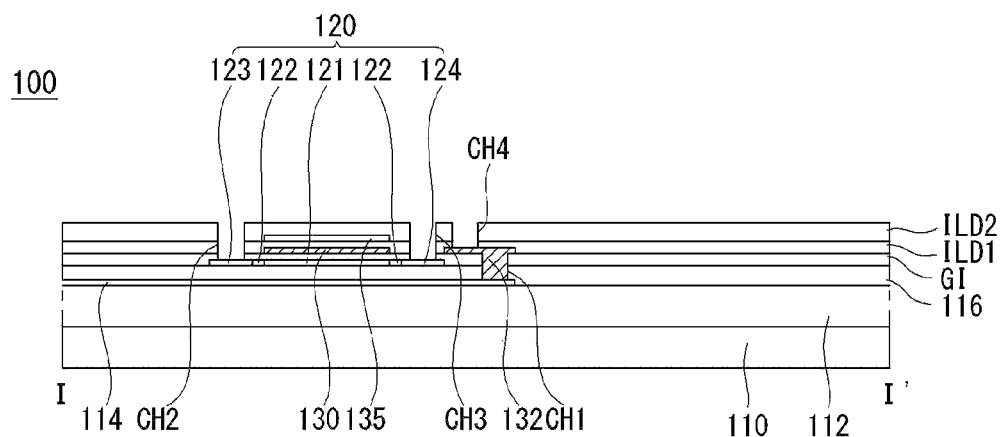

Next, referring to FIG. 6G, a second interlayer dielectric layer ILD2 is formed on the substrate 110, on which the second gate electrode 135 is formed. The second interlayer dielectric layer ILD2 may be formed as a silicon oxide (SiOx) layer, a silicon nitride (SiNx) layer, or a multilayer thereof through the CVD method, the PECVD method, and the like. Subsequently, a photoresist is applied to the second interlayer dielectric layer ILD2, and the second interlayer dielectric layer ILD2, the first interlayer dielectric layer ILD1, and the gate insulating layer GI are etched using a seventh mask. A second contact hole CH2 exposing the drain region 123 of the semiconductor layer 120 and a third contact hole CH3 exposing the source region 124 of the semiconductor layer 120 are formed by etching the second interlayer dielectric layer ILD2, the first interlayer dielectric layer ILD1, and the gate insulating layer GI. Further, the second interlayer dielectric layer ILD2 and the first interlayer dielectric layer ILD1 are etched to form a fourth contact hole CH4 exposing the connection electrode 132.

Figure 6H:
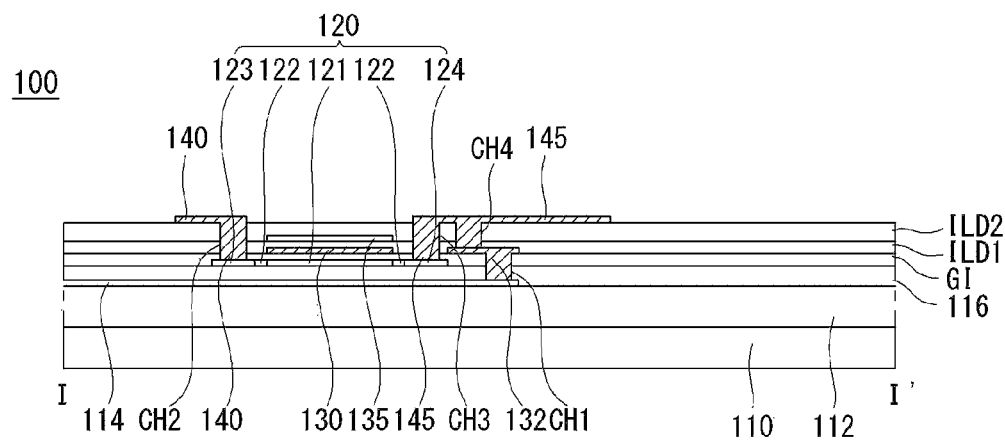

Next, referring to FIG. 6H, a metal material is stacked on the substrate 110, on which the second interlayer dielectric layer ILD2 is formed, and is patterned using an eighth mask to form a drain electrode 140 and a source electrode 145. The drain electrode 140 and the source electrode 145 may be formed as a single layer or a multilayer. When the drain electrode 140 and the source electrode 145 are formed as a single layer, the drain electrode 140 and the source electrode 145 may be formed of one selected from the group including molybdenum (Mo), aluminum (Al), chrome (Cr), gold (Au), titanium (Ti), nickel (Ni), neodymium (Nd), and copper (Cu), or a combination thereof. When the drain electrode 140 and the source electrode 145 are formed as a multilayer, the drain electrode 140 and the source electrode 145 may be formed as a double-layer of Mo/Al—Nd or a triple-layer of Ti/Al/Ti, Mo/Al/Mo or Mo/Al—Nd/Mo.

The drain electrode 140 is connected to the drain region 123 of the semiconductor layer 120 through the second contact hole CH2, and the source electrode 145 is connected to the source region 124 of the semiconductor layer 120 through the third contact hole CH3. Further, the source electrode 145 is connected to the connection electrode 132 through the fourth contact hole CH4. Thus, a driving transistor DR including the semiconductor layer 120, the first gate electrode 130, the drain electrode 140, and the source electrode 145 is formed.

Figure 6I:
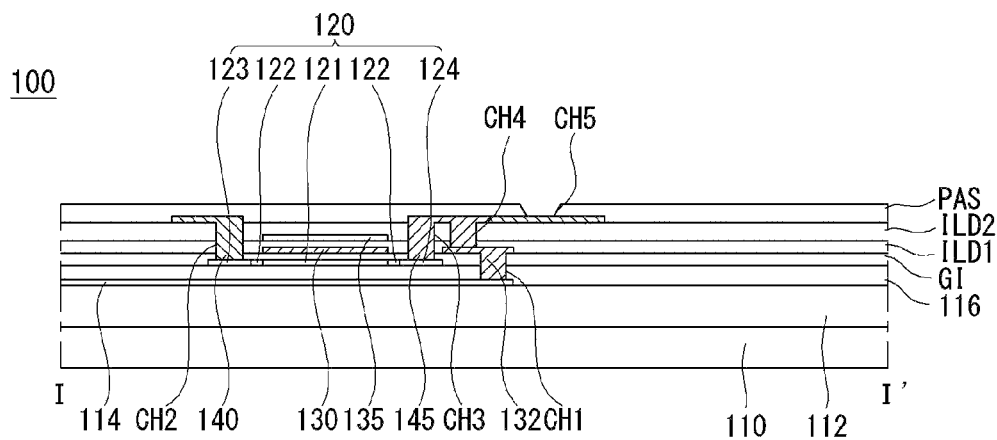

Next, referring to FIG. 6I, a passivation layer PAS is formed on the substrate 110 including the driving transistor DR. The passivation layer PAS may be formed as a silicon oxide (SiOx) layer, a silicon nitride (SiNx) layer, or a multilayer thereof through the CVD method, the PECVD method, and the like. Subsequently, a fifth contact hole CH5 exposing the source electrode 145 is formed by etching the passivation layer PAS using a ninth mask.

Figure 6J:
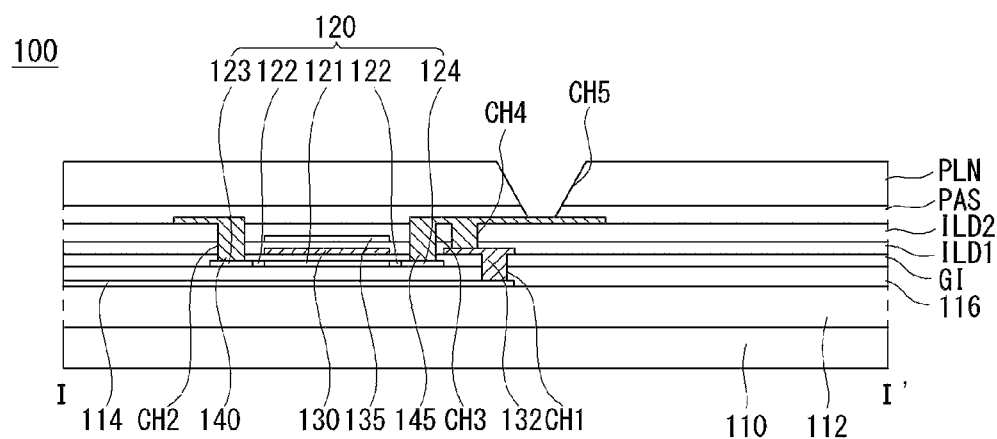

Next, referring to FIG. 6J, a planarization layer PLN is formed on the substrate 110, in which the fifth contact hole CH5 is formed. The planarization layer PLN may be a planarization layer for reducing a height difference of an underlying structure. The planarization layer PLN may be formed of an organic material, such as polyimide, benzocyclobutene-based resin, and acrylate. The planarization layer PLN may be formed through a spin-on glass (SOG) method in which an organic material in a liquid state is coated and then cured. Subsequently, the fifth contact hole CH5 of the passivation layer PAS extends by etching the planarization layer PLN using a tenth mask.

Figure 6K:
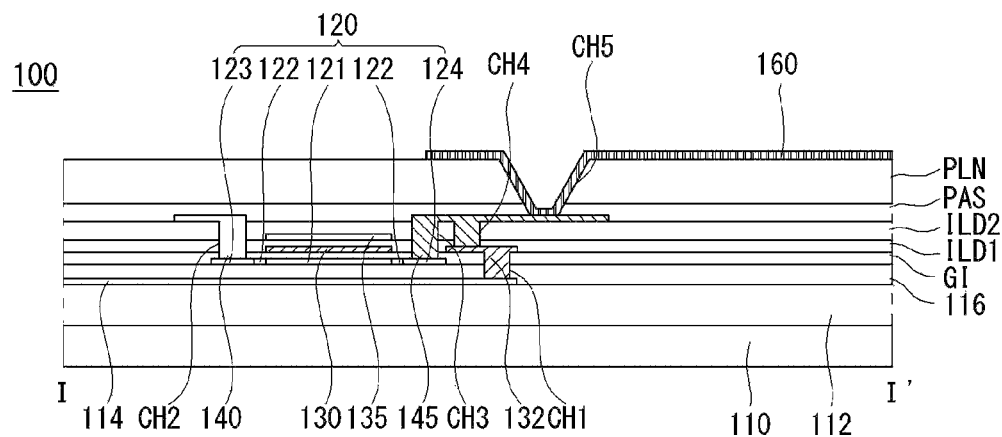

Next, referring to FIG. 6K, a transparent conductive layer is stacked on the planarization layer PLN and is patterned using an eleventh mask to form a first electrode 160. The first electrode 160 is an anode and may be formed of a transparent conductive material such as indium tin oxide (ITO), indium zinc oxide (IZO), and zinc oxide (ZnO). When the first electrode 160 is a reflective electrode, the first electrode 160 further includes a reflective layer. The reflective layer may be formed of aluminum (Al), copper (Cu), silver (Ag), nickel (Ni), Pd (palladium) or a combination thereof. Preferably, the reflective layer may be formed of Ag/Pd/Cu (APC) alloy. Thus, the first electrode 160 is filled in the fifth contact hole CH5 and may be connected to the source electrode 145 of the driving transistor DR.

Figure 6L:
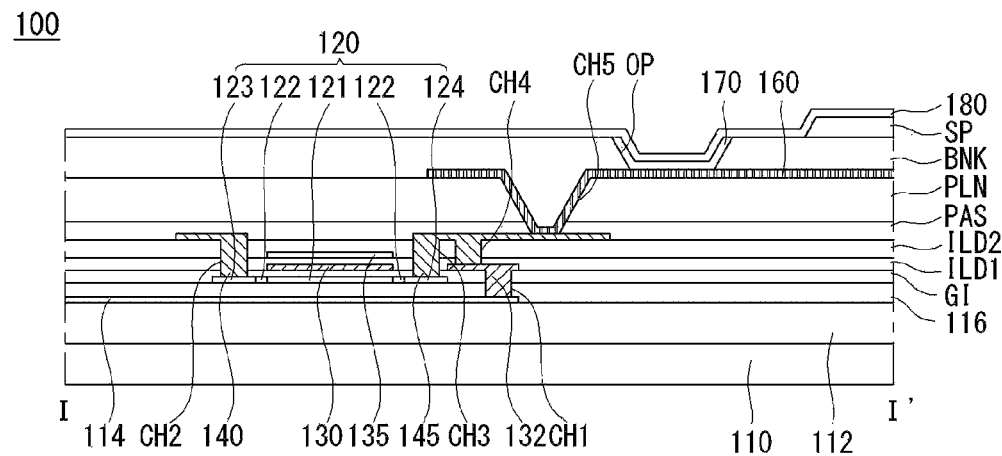

Next, referring to FIG. 6L, a bank layer BNK and a spacer SP are formed on the substrate 110 including the first electrode 160. The bank layer BNK is a pixel definition layer that exposes a portion of the first electrode 160 and defines a pixel, and the spacer SP serves to reduce or prevent a mask from contacting the substrate when a light emitting layer is formed in a subsequent process. The bank layer BNK and the spacer SP may be formed of an organic material, such as polyimide, benzocyclobutene-based resin, and acrylate. An opening OP exposing the first electrode 160 is formed in the bank layer BNK using a halftone mask, a twelfth mask, and the spacer SP is patterned. An organic light emitting layer 170 is formed on the first electrode 160 exposed by the opening OP of the bank layer BNK. The organic light emitting layer 170 is a layer in which electrons and holes combine and emit light. A hole injection layer or a hole transport layer may be positioned between the organic light emitting layer 170 and the first electrode 160, and an electron injection layer or an electron transport layer may be positioned on the organic light emitting layer 170.

Subsequently, a second electrode 180 is formed on the substrate 110 on which the organic light emitting layer 170 is formed. The second electrode 180 is a cathode electrode formed on a front surface of the substrate 110. The second electrode 180 may be formed of magnesium (Mg), calcium (Ca), aluminum (Al), silver (Ag), or a combination thereof, each having a low work function. When the second electrode 180 is a transmissive electrode, the second electrode 180 is beneficially thin enough to transmit light. When the second electrode 180 is a reflective electrode, the second electrode 180 is beneficially thick enough to reflect light. Thus, the OLED display according to the first embodiment of the invention is manufactured using a total of twelve masks.

The OLED display according to the first embodiment of the invention connects the shield layer 114 to the source electrode 145 of the driving transistor DR and applies a source voltage to the shield layer 114. When the source voltage is applied to the shield layer 114, a difference in horizontal energy field (E-field) between the source region 124 and the channel 121 of the semiconductor layer 120 can be reduced. Thus, hot carriers, in which electrons enter into an interface of the semiconductor layer 120 or the gate insulating layer GI, can be reduced or prevented, and thus, reduction in electron mobility and/or on-current of the driving transistor DR can be reduced or prevented. Further, when the driving transistor DR is turned off, its off-current can also be reduced.

The OLED display according to the first embodiment of the invention forms four contact holes in a connection structure of the source electrode, the shield layer, and the first electrode. A second embodiment of the invention describes a method of manufacturing an OLED display having reduced number of contact holes for achieving a high resolution.

Second Embodiment

Figure 7:
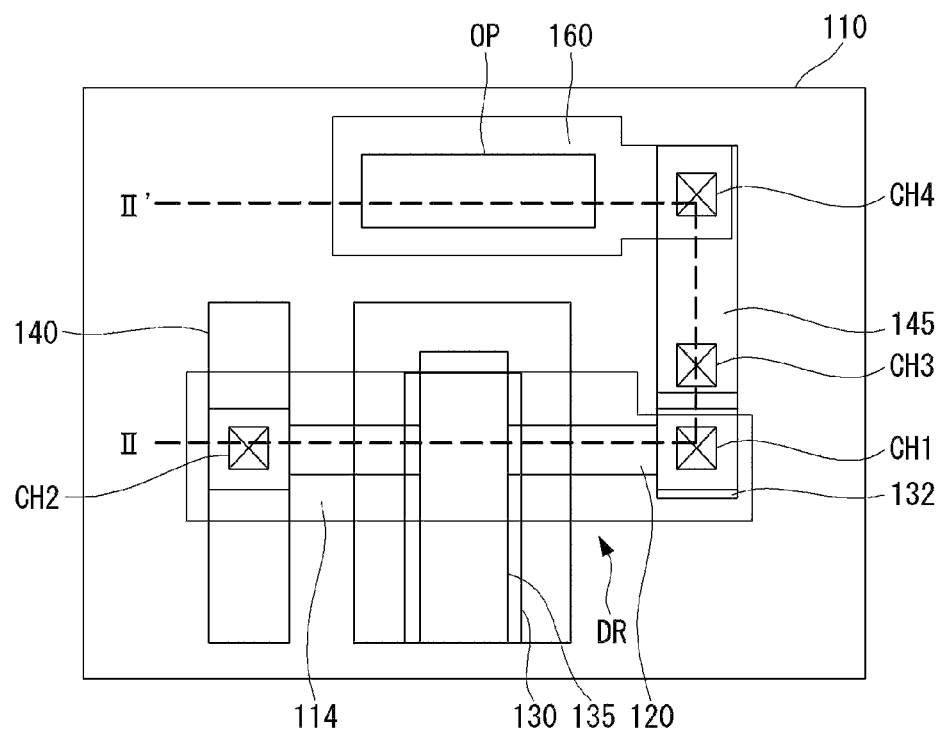
FIG. 7 is a plan view illustrating a part of an OLED display according to a second embodiment of the invention.
Figure 8:
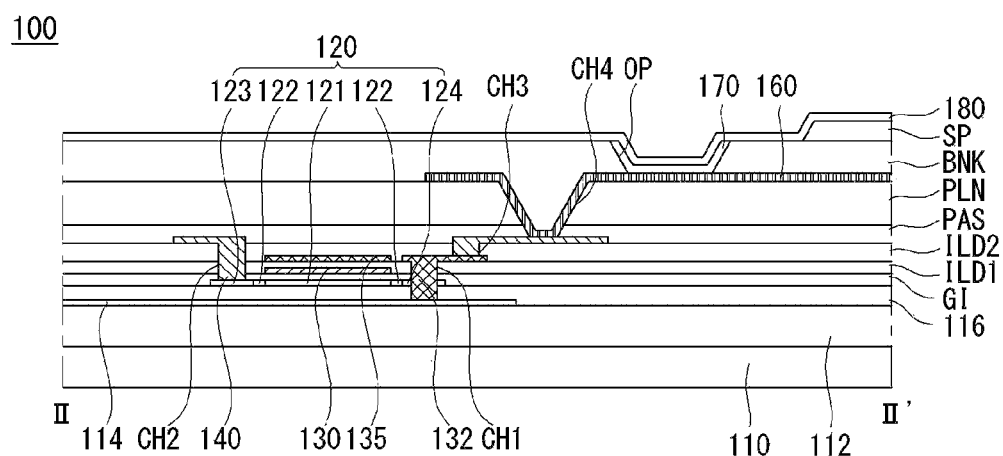
FIG. 8 is a cross-sectional view taken along line II-II' of FIG. 7.

FIG. 7 is a plan view illustrating a part of an OLED display according to a second embodiment of the invention. FIG. 8 is a cross-sectional view taken along line II-II' of FIG. 7. Structures and components identical or equivalent to those described in the first embodiment are designated with the same reference numerals, and a further description may be briefly made or may be entirely omitted in the second embodiment for brevity.

Referring to FIG. 7, a driving transistor DR and a first electrode 160 are connected to each other on a substrate 110. The driving transistor DR includes a semiconductor layer 120 on a shield layer 114, a first gate electrode 130 corresponding to the semiconductor layer 120, a second gate electrode 135 separated from the first gate electrode 130 at a location corresponding to the first gate electrode 130, and a drain electrode 140 and a source electrode 145 respectively connected to both sides of the semiconductor layer 120.

A connection electrode 132 is connected to the shield layer 114 and the semiconductor layer 120 through a first contact hole CHE The source electrode 145 of the driving transistor DR is connected to the connection electrode 132 through a third contact hole CH3 and thus is electrically connected to the semiconductor layer 120. The drain electrode 140 of the driving transistor DR is connected to the semiconductor layer 120 through a second contact hole CH2. Further, the source electrode 145 is connected to the connection electrode 132 and is electrically connected to the shield layer 114. The source electrode 145 of the driving transistor DR is connected to the first electrode 160 through a fourth contact hole CH4. The first electrode 160 is exposed by an opening OP of a bank layer (not shown).

More specifically, referring to FIG. 8, in the OLED display 100 according to the second embodiment of the invention, a first buffer layer 112 is positioned on the substrate 110, and the shield layer 114 is positioned on the first buffer layer 112. The shield layer 114 serves to prevent reduction in a panel driving current which may be generated by using a substrate formed of polyimide. A second buffer layer 116 is positioned on the shield layer 114, and the semiconductor layer 120 is positioned on the second buffer layer 116. The semiconductor layer 120 includes a drain region 123 and a source region 124, each including p-type or n-type impurities and a channel 121 between the drain region 123 and the source region 124. The semiconductor layer 120 further includes a lightly doped region 122 between the drain region 123 and the source region 124 adjacent to the channel 121.

A gate insulating layer GI is positioned on the semiconductor layer 120. The first gate electrode 130 is positioned on the gate insulating layer GI in a predetermined region of the semiconductor layer 120, namely, at a location corresponding to the channel 121 when impurities are injected. The first gate electrode 130 serves as a gate electrode of the driving transistor DR. A first interlayer dielectric layer ILD1 is positioned on the first gate electrode 130 to insulate the first gate electrode 130. The second gate electrode 135 and the connection electrode 132 are positioned on the first interlayer dielectric layer ILD1. The second gate electrode 135 is a capacitor electrode forming a capacitor together with the first gate electrode 130 and does not operate as a gate electrode of the driving transistor DR. The connection electrode 132 is connected to the shield layer 114 through the first contact hole CH1 passing through the first interlayer dielectric layer ILD1, the gate insulating layer GI, the semiconductor layer 120, and the second buffer layer 116. Further, the connection electrode 132 is connected to the semiconductor layer 120 through the first contact hole CH1. The first contact hole CH1 has a structure passing through the source region 124 of the semiconductor layer 120. Hence, when the first contact hole CH1 is filled with the connection electrode 132, the connection electrode 132 contacts a side of the semiconductor layer 120 and can be electrically connected to the semiconductor layer 120. Thus, the connection electrode 132 can be electrically connected to the semiconductor layer 120 and the shield layer 114 through the first contact hole CH1 at once.

A second interlayer dielectric layer ILD2 is positioned on the second gate electrode 135 and the connection electrode 132 to insulate the second gate electrode 135. The second and third contact holes CH2 and CH3 are positioned in a portion of each of the second interlayer dielectric layer ILD2, the first interlayer dielectric layer ILD1, and the gate insulating layer GI to expose a portion of the semiconductor layer 120. More specifically, the second contact hole CH2 exposes the drain region 123 of the semiconductor layer 120, and the third contact hole CH3 exposes the connection electrode 132.

The drain electrode 140 and the source electrode 145 are positioned on the second interlayer dielectric layer ILD2. The drain electrode 140 is connected to the semiconductor layer 120 through the second contact hole CH2 exposing the drain region 123 of the semiconductor layer 120, and the source electrode 145 is connected to the semiconductor layer 120 through the third contact hole CH3 exposing the connection electrode 132. Thus, the driving transistor DR including the semiconductor layer 120, the first gate electrode 130, the drain electrode 140, and the source electrode 145 is formed.

A passivation layer PAS is positioned on the substrate 110 including the driving transistor DR. A planarization layer PLN is positioned on the passivation layer PAS to planarize the parts underlying the planarization layer PLN. The fourth contact hole CH4 is positioned in a portion of each of the passivation layer PAS and the planarization layer PLN to expose the source electrode 145. The first electrode 160 is positioned on the planarization layer PLN. The first electrode 160 serves as a pixel electrode and is connected to the source electrode 145 of the driving transistor DR through the fourth contact hole CH4. A bank layer BNK is positioned on the substrate 110 including the first electrode 160 to define the pixel. The bank layer BNK includes the opening OP exposing the first electrode 160. A light emitting layer 170 contacting the first electrode 160 is positioned in the opening OP of the bank layer BNK, and a second electrode 180 is positioned on the light emitting layer 170.

The OLED display according to the second embodiment of the invention includes the first contact hole CH1 that passes through the source region 124 of the semiconductor layer 120 and exposes the shield layer 114, thereby connecting the connection electrode 132 to the semiconductor layer 120 and the shield layer 114 through the first contact hole CH1 at once. Thus, the OLED display according to the second embodiment of the invention can reduce a total of two contact holes respectively connected to the semiconductor layer 120 and the shield layer 114 to one.

A method for manufacturing the OLED display according to the second embodiment of the invention will now described. Duplicative description will be omitted for brevity.

Figure 10:
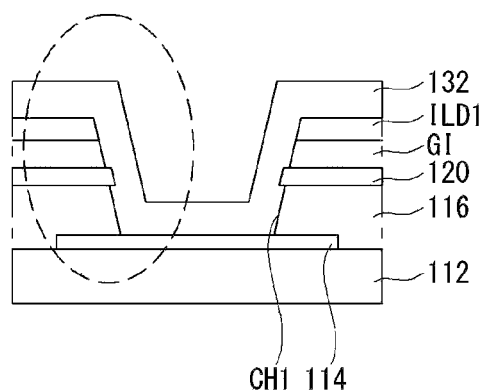
FIG. 10 is a cross-sectional view illustrating a first contact hole of an OLED display according to an embodiment of the invention.
Figure 11:
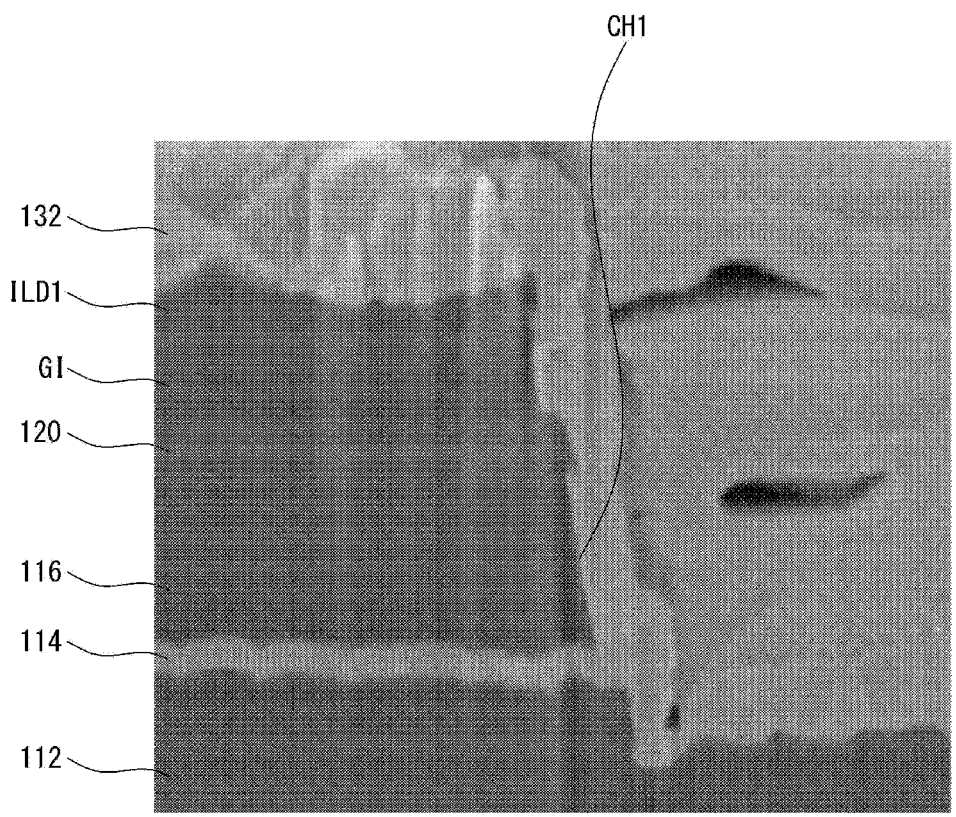
FIG. 11 illustrates an image of a first contact hole shown in FIG. 10 taken using a scanning electron microscope (SEM).

FIGS. 9A to 9L are cross-sectional views sequentially illustrating a method for manufacturing the OLED display according to the second embodiment of the invention. FIG. 10 is a cross-sectional view illustrating a first contact hole of an OLED display according to an embodiment of the invention. FIG. 11 illustrates an image of a first contact hole shown in FIG. 10 taken using a scanning electron microscope (SEM).

Figure 9A:
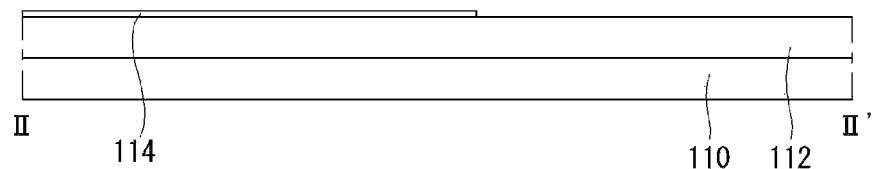
FIGS. 9A to 9L are cross-sectional views sequentially illustrating each of stages in a method for manufacturing an OLED display according to a second embodiment of the invention.

Referring to FIG. 9A, a first buffer layer 112 is formed on a substrate 110. An opaque material is stacked on the first buffer layer 112 and is patterned using a first mask to form a shield layer 114.

Figure 9B:
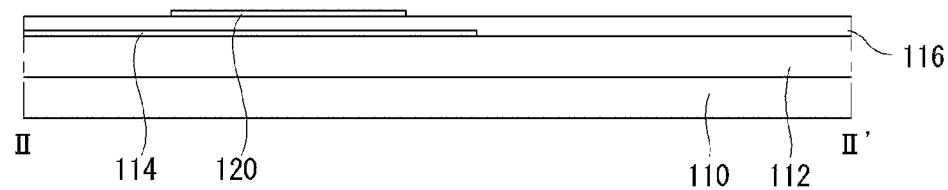

Next, referring to FIG. 9B, a second buffer layer 116 is formed on the substrate 110, on which the shield layer 114 is formed. A silicon semiconductor or an oxide semiconductor is stacked on the second buffer layer 116 and is patterned using a second mask to form a semiconductor layer 120.

Figure 9C:
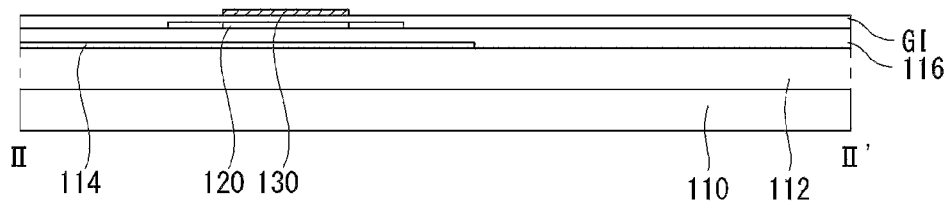

Next, referring to FIG. 9C, a gate insulating layer GI is formed on the substrate 110 including the semiconductor layer 120. A metal material is stacked on the gate insulating layer GI and is patterned using a third mask to form a first gate electrode 130. Subsequently, n-type impurities are lightly doped on a front surface of the substrate 110 to dope the semiconductor layer 120. In this instance, a remaining portion of the semiconductor layer 120 except the semiconductor layer 120 underlying the first gate electrode 130 is doped using the first gate electrode 130 on the semiconductor layer 120 as a mask.

Figure 9D:
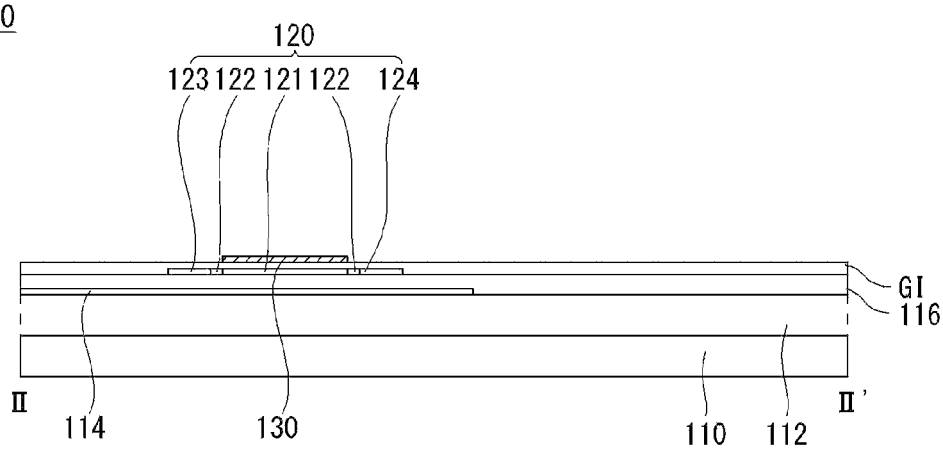

Next, referring to FIG. 9D, n-type impurities are heavily doped on the front surface of the substrate 110 to dope the semiconductor layer 120. In this instance, a channel 121, a lightly doped region 122, a drain region 123, and a source region 124 are formed at the semiconductor layer 120 by masking and doping a predetermined region of the semiconductor layer 120 using a fourth mask.

Figure 9E:
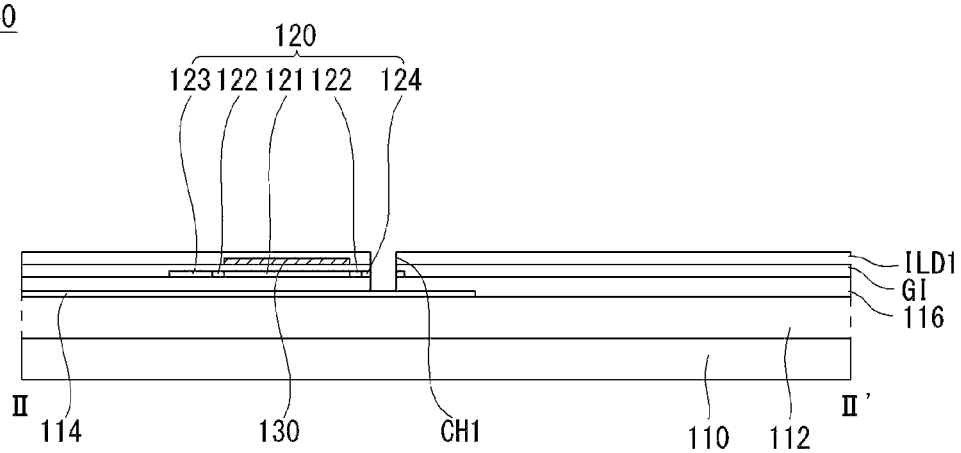

Next, referring to FIG. 9E, a first interlayer dielectric layer ILD1 is formed on the substrate 110, on which the first gate electrode 130 is formed. The first interlayer dielectric layer ILD1, the second buffer layer 116, and the gate insulating layer GI are etched using a fifth mask to form a first contact hole CH1 exposing the shield layer 114. The first contact hole CH1 is formed to pass through the source region 124 of the semiconductor layer 120 and expose the shield layer 114. Thus, the semiconductor layer 120 is exposed to an inner circumference surface of the first contact hole CH1.

Figure 9F:
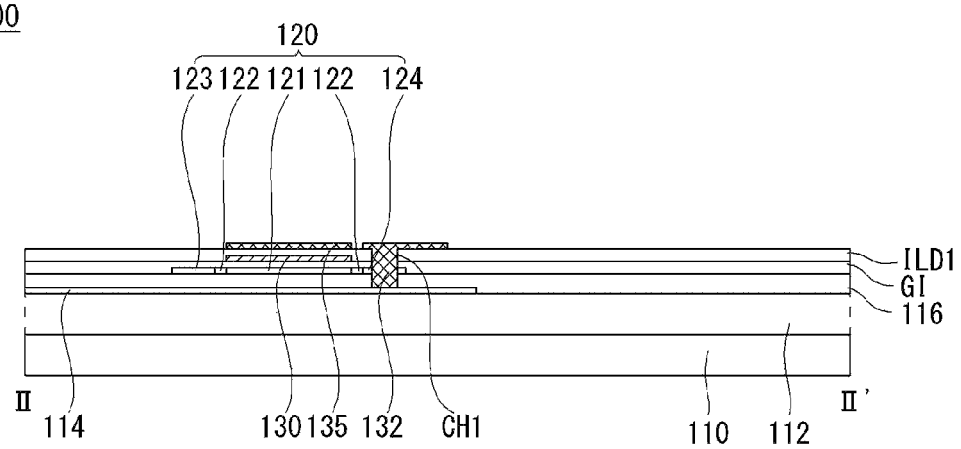

Next, referring to FIG. 9F, a metal material is stacked on the substrate 110, in which the first contact hole CH1 is formed, and is patterned using a sixth mask to form a second gate electrode 135 and a connection electrode 132. The second gate electrode 135 is formed to overlap the first gate electrode 130 and may form a capacitance together with the first gate electrode 130. The connection electrode 132 is filled in the first contact hole CH1 and is simultaneously connected to the shield layer 114 and the source region 124 of the semiconductor layer 120. Thus, the connection electrode 132 can be simultaneously connected to the shield layer 114 and the semiconductor layer 120 through the first contact hole CH1. Hence, the number of contact holes for connecting the connection electrode 132 to both the shield layer 114 and the semiconductor layer 120 can be reduced from two to one.

Figure 9G:
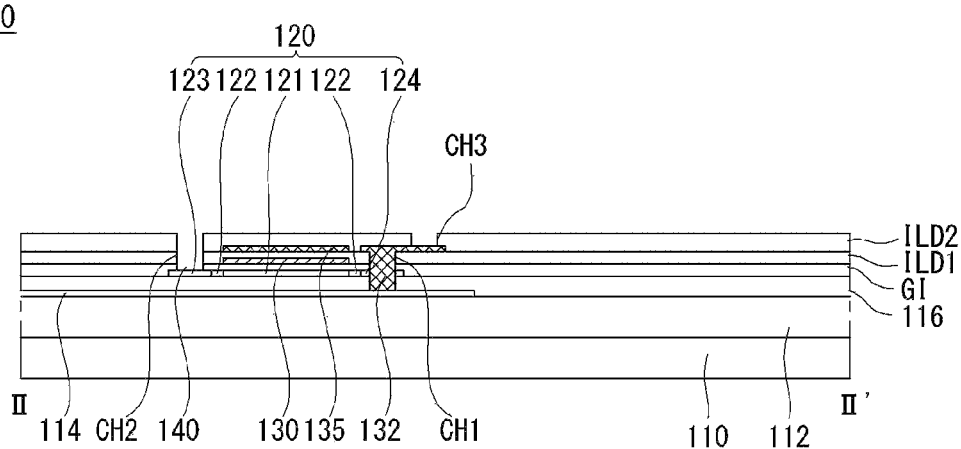

Next, referring to FIG. 9G, a second interlayer dielectric layer ILD2 is formed on the substrate 110, on which the second gate electrode 135 and the connection electrode 132 are formed. A photoresist is applied to the second interlayer dielectric layer ILD2, and the second interlayer dielectric layer ILD2, the first interlayer dielectric layer ILD1, and the gate insulating layer GI are etched using a seventh mask. A second contact hole CH2 exposing the drain region 123 of the semiconductor layer 120 is formed by etching the second interlayer dielectric layer ILD2, the first interlayer dielectric layer ILD1, and the gate insulating layer GI. Further, the second interlayer dielectric layer ILD2 is etched to form a third contact hole CH3 exposing the connection electrode 132.

Figure 9H:
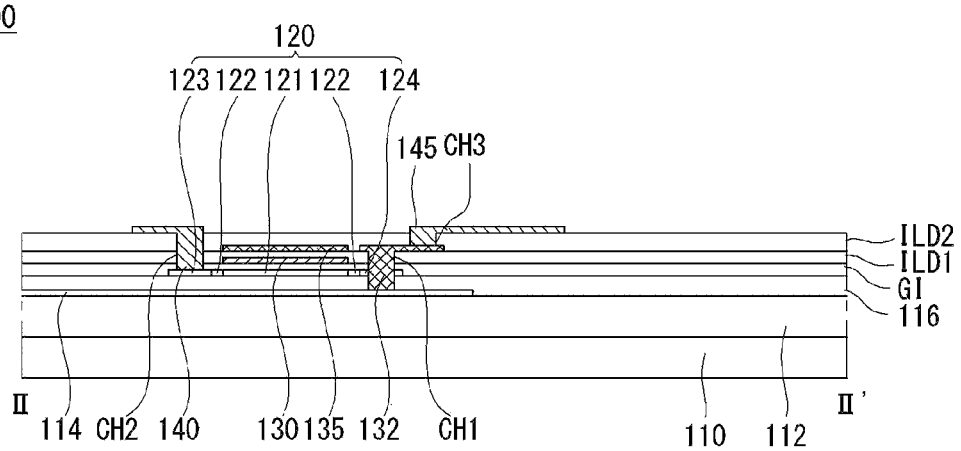

Next, referring to FIG. 9H, a metal material is stacked on the substrate 110, on which the second interlayer dielectric layer ILD2 is formed, and is patterned using an eighth mask to form a drain electrode 140 and a source electrode 145. The drain electrode 140 is connected to the drain region 123 of the semiconductor layer 120 through the second contact hole CH2, and the source electrode 145 is connected to the connection electrode 132 through the third contact hole CH3. Further, the source electrode 145 is electrically connected to the semiconductor layer 120 through the connection electrode 132 connected to the source region 124 of the semiconductor layer 120. Thus, a driving transistor DR including the semiconductor layer 120, the first gate electrode 130, the drain electrode 140, and the source electrode 145 is formed.

Figure 9I:
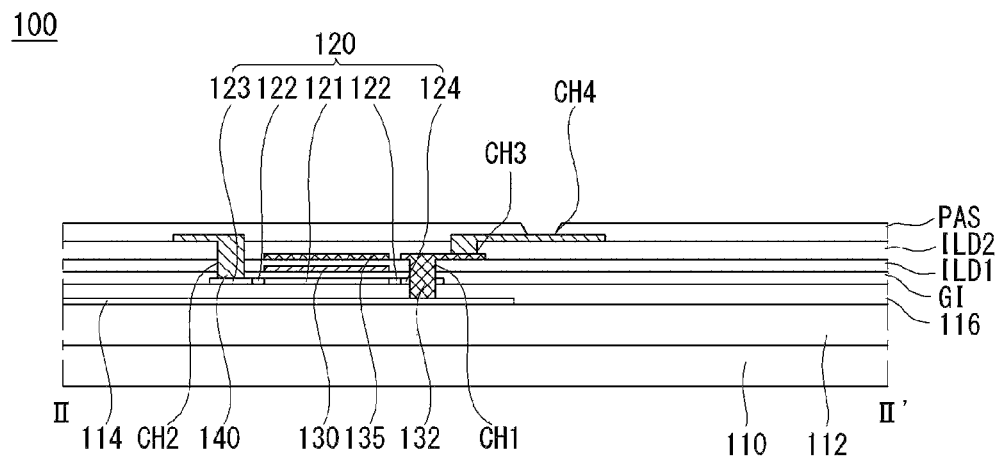

Next, referring to FIG. 9I, a passivation layer PAS is formed on the substrate 110 including the driving transistor DR. A fourth contact hole CH4 exposing the source electrode 145 is formed by etching the passivation layer PAS using a ninth mask.

Figure 9J:
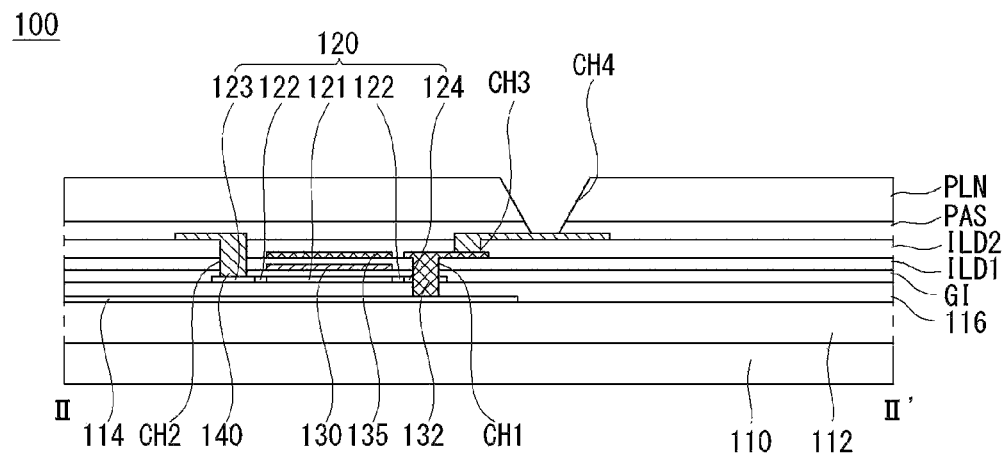

Next, referring to FIG. 9J, a planarization layer PLN is formed on the substrate 110, in which the fourth contact hole CH4 is formed. The fourth contact hole CH4 of the passivation layer PAS extends by etching the planarization layer PLN using a tenth mask.

Figure 9K:
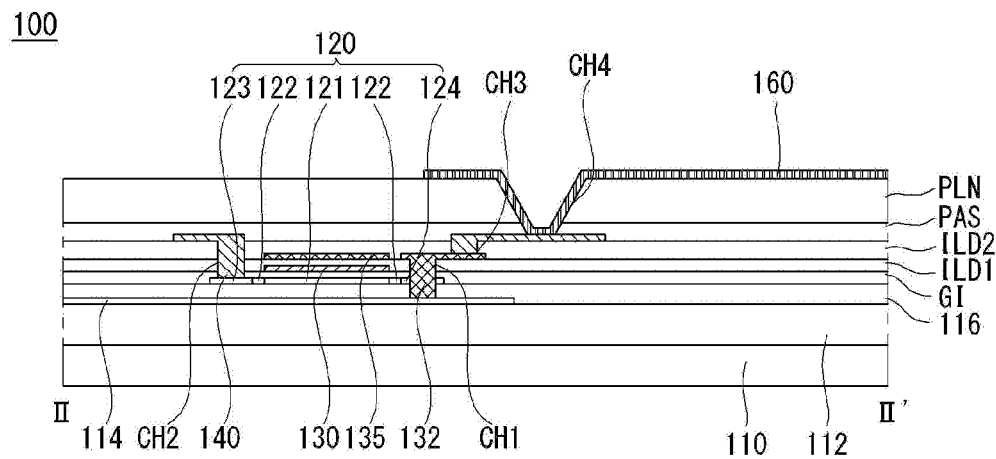

Next, referring to FIG. 9K, a transparent conductive layer is stacked on the planarization layer PLN and is patterned using an eleventh mask to form a first electrode 160. The first electrode 160 is filled in the fourth contact hole CH4 and may be connected to the source electrode 145 of the driving transistor DR.

Figure 9L:
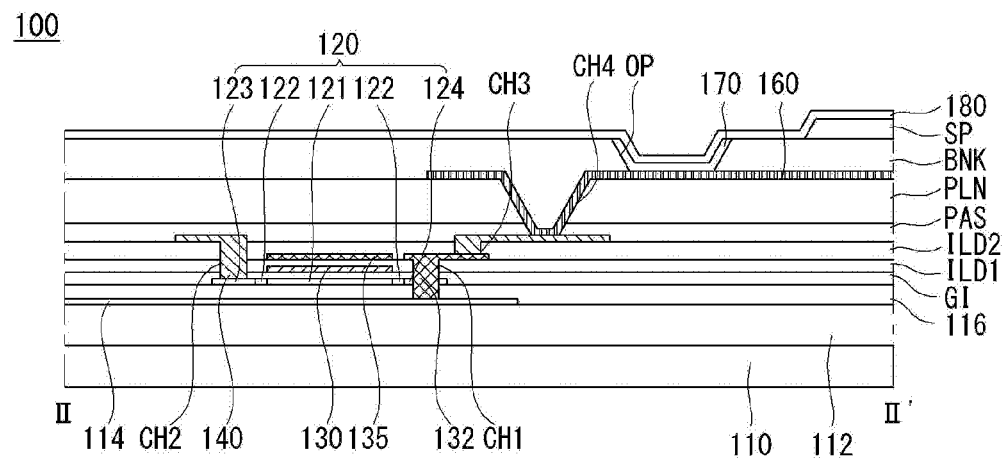

Next, referring to FIG. 9L, a bank layer BNK and a spacer SP are formed on the substrate 110 including the first electrode 160. The bank layer BNK is a pixel definition layer that exposes a portion of the first electrode 160 and defines a pixel, and the spacer SP serves to reduce or prevent a mask from contacting the substrate when a light emitting layer is formed in a subsequent process. The bank layer BNK and the spacer SP may be formed of an organic material, such as polyimide, benzocyclobutene-based resin, and acrylate. An opening OP exposing the first electrode 160 is formed in the bank layer BNK using a halftone mask, a twelfth mask, and the spacer SP is patterned. Subsequently, an organic light emitting layer 170 is formed on the first electrode 160 exposed by the opening OP of the bank layer BNK. A second electrode 180 is formed on the substrate 110, on which the organic light emitting layer 170 is formed. Thus, the OLED display according to the second embodiment of the invention is manufactured using a total of twelve masks.

Referring to FIG. 10, a first contact hole CH1 passes through a first interlayer dielectric layer ILD1, a gate insulating layer GI, a semiconductor layer 120, and a second buffer layer 116 and exposes a shield layer 114. The side of the semiconductor layer 120 is exposed to an inner circumference surface of the first contact hole CH1. A connection electrode 132 is formed in the first contact hole CH1 and is connected to the shield layer 114 while being filled in the first contact hole CH1. In this instance, because the first contact hole CH1 is filled with the connection electrode 132, the connection electrode 132 contacts a side of the semiconductor layer 120 exposed to the inner circumference surface of the first contact hole CH1. Thus, the connection electrode 132 is connected to both the semiconductor layer 120 and the shield layer 114.

As shown in FIG. 11, the connection electrode 132 is formed along the first contact hole CH1 and contacts both the semiconductor layer 120 exposed to the inner circumference surface of the first contact hole CH1 and the shield layer 114.

The OLED display according to the second embodiment of the invention includes the first contact hole CH1 that passes through the source region 124 of the semiconductor layer 120 and exposes the shield layer 114, thereby connecting the connection electrode 132 to the semiconductor layer 120 and the shield layer 114 through the first contact hole CH1 at once. Thus, the OLED display according to the second embodiment of the invention can reduce a total of two contact holes respectively connected to the semiconductor layer 120 and the shield layer 114 to one. As a result, the second embodiment of the invention can reduce the number of contact holes formed inside the pixel, and can reduce the pixel size by reducing the number of contact holes and thus achieve a high resolution.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
   a shield layer on a substrate;
   a semiconductor layer on the shield layer;
   a gate insulating layer on the semiconductor layer;
   a first gate electrode on the gate insulating layer;
   a first interlayer dielectric layer on the first gate electrode;
   a second gate electrode and a connection electrode on the first interlayer dielectric layer, the connection electrode electrically connected to the shield layer and passing through the semiconductor layer;
   a second interlayer dielectric layer on the second gate electrode and the connection electrode;
   a source electrode and a drain electrode on the second interlayer dielectric layer, the drain electrode electrically connected to the semiconductor layer and the source electrode electrically connected to the connection electrode;
   an insulating layer on the drain electrode and the source electrode; and
   a first electrode on the insulating layer and electrically connected to the source electrode.

2. The organic light emitting diode display of claim 1, further comprising a buffer layer on the shield layer.

3. The organic light emitting diode display of claim 1, wherein the second gate electrode is on the first interlayer dielectric layer, substantially corresponding to the first gate electrode.

4. The organic light emitting diode display of claim 2, wherein the connection electrode is electrically connected to the shield layer through a first contact hole passing through the first interlayer dielectric layer, the gate insulating layer, the semiconductor layer, and the buffer layer.

5. The organic light emitting diode display of claim 4, wherein the connection electrode contacts the semiconductor layer exposed to an inner circumference surface of the first contact hole.

6. The organic light emitting diode display of claim 5, wherein the semiconductor layer includes a channel, a lightly doped region, a source region, and a drain region.

7. The organic light emitting diode display of claim 6, wherein the connection electrode contacts the source region of the semiconductor layer.

8. The organic light emitting diode display of claim 1, wherein the source electrode is electrically connected to the semiconductor layer through a second contact hole passing through the second interlayer dielectric layer, the first interlayer dielectric layer, and the gate insulating layer.

9. The organic light emitting diode display of claim 1, wherein the source electrode is electrically connected to the connection electrode through a third contact hole passing through the second interlayer dielectric layer.

10. The organic light emitting diode display of claim 1, wherein the connection electrode is positioned on the same layer as the first gate electrode.

11. The organic light emitting diode display of claim 1, wherein the source electrode is separated from the semiconductor layer.

12. The organic light emitting diode display of claim 1, wherein the insulating layer on the drain electrode and the source electrode is a planarization layer.

* * * * *